United States Patent
Krutz et al.

(10) Patent No.: US 9,683,663 B2
(45) Date of Patent: Jun. 20, 2017

(54) ELECTROACTIVE ACTUATORS, SYSTEMS EQUIPPED THEREWITH, AND METHODS OF USE AND MANUFACTURE

(71) Applicant: PURDUE RESEARCH FOUNDATION, West Lafayette, IN (US)

(72) Inventors: Gary William Krutz, West Lafayette, IN (US); Brittany Ann Newell, Delphi, IN (US)

(73) Assignee: Purdue Research Foundation, West Lafayette, IN (US)

( * ) Notice: Subject to any disclaimer, the term of this patent is extended or adjusted under 35 U.S.C. 154(b) by 336 days.

(21) Appl. No.: 14/371,448

(22) PCT Filed: Jan. 25, 2013

(86) PCT No.: PCT/US2013/023165
§ 371 (c)(1),
(2) Date: Jul. 10, 2014

(87) PCT Pub. No.: WO2013/112849
PCT Pub. Date: Aug. 1, 2013

(65) Prior Publication Data
US 2015/0091254 A1    Apr. 2, 2015

Related U.S. Application Data

(60) Provisional application No. 61/590,561, filed on Jan. 25, 2012.

(51) Int. Cl.
*H01L 41/04*    (2006.01)
*F16J 15/02*    (2006.01)
(Continued)

(52) U.S. Cl.
CPC ........... *F16J 15/022* (2013.01); *F16J 15/008* (2013.01); *F16J 15/068* (2013.01);
(Continued)

(58) Field of Classification Search
CPC .... H01L 41/09; H01L 41/047; H01L 41/0478
(Continued)

(56) References Cited

U.S. PATENT DOCUMENTS 5,977,685 A * 11/1999 Kurita .................... C08G 18/10
310/311
6,891,317 B2 * 5/2005 Pei ......................... A61M 5/142
310/328
(Continued)

FOREIGN PATENT DOCUMENTS

WO    2008113372    9/2008

*Primary Examiner* — J. San Martin
(74) *Attorney, Agent, or Firm* — Hartman Global IP Law; Gary M Hartman; Michael D. Winter

(57) ABSTRACT

Actuators and methods utilizing electrical properties of polymer materials. The actuators have a multilayer structure that includes an electroactive polymer layer between and bonded to first and second electrodes so that the polymer layer has a thickness dimension therebetween. The multilayer structure is adapted so that application of an electric potential to the electrodes causes the electroactive polymer layer to expand in at least one dimension thereof transverse to the thickness dimension of the electroactive polymer layer. The actuators can be used in sealing elements to provide a resealing capability once a condition has occurred of a type that may precede a seal failure.

9 Claims, 3 Drawing Sheets

(51) Int. Cl.
*F16J 15/00* (2006.01)
*F16J 15/06* (2006.01)
*F16J 15/3284* (2016.01)
*H01L 41/047* (2006.01)
*H01L 41/09* (2006.01)
*H01L 41/193* (2006.01)

(52) U.S. Cl.
CPC ........ *F16J 15/3284* (2013.01); *H01L 41/047* (2013.01); *H01L 41/0478* (2013.01); *H01L 41/0986* (2013.01); *H01L 41/193* (2013.01)

(58) Field of Classification Search
USPC .................................................. 310/328, 800
See application file for complete search history.

(56) References Cited

U.S. PATENT DOCUMENTS

| | | | |
|---|---|---|---|
| 7,732,999 B2 * | 6/2010 | Clausen | H01L 41/083 310/328 |
| 7,761,981 B2 * | 7/2010 | Rosenthal | A61M 5/142 29/825 |
| 7,783,333 B2 * | 8/2010 | Brister | A61B 5/1411 600/309 |
| 7,834,527 B2 * | 11/2010 | Alvarez Icaza Rivera | H01L 41/0478 310/344 |
| 7,880,371 B2 * | 2/2011 | Benslimane | H01L 41/083 310/367 |
| 7,896,809 B2 * | 3/2011 | Simpson | A61B 5/14532 600/345 |
| 8,364,229 B2 * | 1/2013 | Simpson | A61B 5/14532 600/309 |
| 8,458,889 B2 * | 6/2013 | Tsuchikawa | A61F 2/08 29/595 |
| 8,583,204 B2 * | 11/2013 | Boock | A61B 5/14532 600/345 |
| 8,682,408 B2 * | 3/2014 | Boock | A61B 5/14532 600/345 |
| 9,247,900 B2 * | 2/2016 | Brister | A61B 5/14865 |
| 9,370,640 B2 * | 6/2016 | Zhang | A61M 25/0158 |
| 2003/0006669 A1 | 1/2003 | Pei et al. | |

* cited by examiner

ELECTROACTIVE ACTUATORS, SYSTEMS EQUIPPED THEREWITH, AND METHODS OF USE AND MANUFACTURE

CROSS REFERENCE TO RELATED APPLICATIONS

This application claims priority to PCT Application No. PCT/US13/23165 filed Jan. 25, 2013, which claims the benefit of U.S. Provisional Application No. 61/590,561, filed Jan. 25, 2012. The contents of these prior patent documents are incorporated herein by reference.

BACKGROUND OF THE INVENTION

The present invention generally relates to polymeric structures, and more particularly to actuators and methods utilizing electrical properties of polymer materials.

Components formed of polymeric materials are often critical to the performance of the products in which they are used, which encompasses various industries including medical, automotive, aviation, aerospace, appliances, and many others. A particular example is the catastrophic failure of a seal, which can be extremely detrimental to a device or machine in which it is installed. As used herein, a seal is a component capable of use in a static and/or dynamic system and is responsible for preventing leaks, maintaining system pressure, preventing contamination, or another similar function relating to the retention or separation of fluids (gases and liquids). Conventional seals are primarily composed of rubber materials due to their advantageous mechanical properties, including flexibility, high bulk modulus (resistance to change in volume under loads), resistance to cuts and tears, long fatigue life, ease of manufacturability, and low cost. When stress or strain energy is applied to a seal, the rubber material internally rearranges and can store energy or dissipate energy. When energy is stored the applied stress creates a corresponding strain resulting in a contact stress (sealing force). However, a loss of sealing force can occur as the polymer chains of the rubber material rearrange to reduce their internal energy over time, referred to as creep.

Isolated locations in which seals and other polymeric components are often installed complicate the ability to monitor their performance and structural failures using conventional electronic sensors. Nonetheless, methods and systems have been developed for the purpose of monitoring various polymer materials and structures for the purpose of detecting an impending failure. Notable examples include U.S. Pat. Nos. 7,555,936 and 7,752,904, which teach the incorporation of sensing elements embedded in polymeric materials.

In addition to detecting an impending catastrophic failure, the ability to reseal a sealing interface or at least reduce the amount of leakage at the interface would give operators additional time to order replacement seals, prepare to shut down the device, or take any other appropriate actions. As a nonlimiting example, o-rings (annular-shaped seals) are sized and shaped to be placed in a groove (gland) having prescribed dimensions to promote the sealing effect of the o-ring. O-ring grooves typically have square or rectangular-shaped cross-sections that, when an appropriate o-ring is placed into the groove, results in the o-ring being compressed to achieve a desired level of deformation. O-ring failure and resulting leakage can occur though a number of mechanisms, many of which can be traced to improper installation or mechanical damage. Another cause in seal failure is an inadequate compression setting that results in the development of an inadequate seal line. In addition to common seal configurations such as o-rings, the benefits of achieving a resealing capability would be desirable in a wide variety of seal types and shapes.

A group of polymeric materials known as electroactive polymers (EAP) have been considered for various applications due to their ability to convert electrical energy into mechanical motion through a process of deformation. Notable examples include actuators in which motion can be induced by the application of electrical energy to an EAP material. EAPs can be divided into two subcategories, ionic and electric EAPs. Dielectric EAP materials are a subclass of electric EAPs that are viscoelastic and exhibit properties similar to dielectric materials of capacitors when positioned between two conductive electrodes that apply a large voltage, for example, in a range of about 1000 to about 10,000 V at low (micro-amp) current levels. In view of these conditions, the overall energy consumption or power to deform (actuate) a dielectric EAP material is low. When a sufficient electrical potential is applied to the electrodes, Coulomb forces cause electrostatic stresses to occur that cause the viscoelastic EAP material to reallocate its volume, forcing it to constrict in thickness and expand (strain) in the in-plane (length and width) directions. This deformation brings the oppositely charged electrodes into closer proximity relative to one another. When the electromagnetic field is removed, the EAP material substantially returns to its original state.

Various obstacles exist that have limited the manufacture and implementation of EAP materials in devices and machinery, including the generation of adequate forces and deformations, durability, and powering complications. Notable improvements have been achieved to increase deformations achievable with dielectric EAP materials by pre-straining the material prior to the application of the electrodes and through construction of multilayer systems. For example, certain types of dielectric EAP materials, examples being VHB 4905 and 4910 acrylic-based materials commercially available from 3M, can achieve pre-strains of greater than 200% that are capable of greatly increasing their actuation strains. Experimentation has been conducted with two-dimensional restricted flat sheets as well as multilayered and rolled configurations, resulting in increased achievable forces due to the summation of forces generated at each layer.

BRIEF DESCRIPTION OF THE INVENTION

The present invention provides actuators and methods utilizing electrical properties of polymer materials, including but not limited to sealing systems, elements and methods that are capable of providing a resealing capability once a condition has occurred of a type that may precede a seal failure.

According to a first aspect of the invention, an actuator is provided having a multilayer structure that includes first and second electrodes formed of electrically-conductive polymer materials, and an electroactive polymer layer formed of a dielectric elastomer. The electroactive polymer layer is between and bonded to the first and second electrodes so as to have a thickness dimension therebetween, and the multilayer structure is adapted so that applying an electric potential to the first and second electrodes causes the electroactive polymer layer to expand in at least one dimension thereof transverse to the thickness dimension of the electroactive polymer layer.

According to a second aspect of the invention, a system is provided for attaining a sealing effect at a sealing interface. The system has a sealing element that includes an elastomeric core and a multilayer structure on the elastomeric core. The multilayer structure includes first and second electrodes and an electroactive polymer material therebetween and bonded thereto. The multilayer structure is adapted so that applying an electric potential to the first and second electrodes causes the electroactive polymer material to expand in at least one dimension thereof to increase the sealing effect of the sealing element at the sealing interface.

According to a third aspect of the invention, a method of maintaining a sealing interface is provided that includes placing a sealing element at the sealing interface to attain a sealing effect at the sealing interface and monitoring distortion of the sealing element. The sealing element includes first and second electrodes and an electroactive polymer material therebetween and bonded thereto. In the event that the distortion of the sealing element attains a predetermined level, an electric potential is applied to the first and second electrodes to cause the electroactive polymer material to expand in at least one dimension thereof to increase the sealing effect of the sealing element at the sealing interface.

According to a fourth aspect of the invention, a method of fabricating an actuator is provided that includes inducing a strain memory state in an electroactive polymer material by a pre-straining technique that expands the electroactive polymer material and then releases the electroactive polymer material to allow the electroactive polymer material to substantially shrink to pre-strained dimensions thereof. Thereafter, first and second electrodes are bonded to opposite surfaces of the electroactive polymer material.

A technical effect of the invention is the ability to provide, manufacture, and use an actuator that utilizes electrical properties of polymer materials to generate motion of the actuator. As previously noted, notable but nonlimiting examples include sealing systems, elements and methods that are capable of providing a resealing capability once a condition has occurred of a type that may precede a seal failure.

Other aspects and advantages of this invention will be better appreciated from the following detailed description.

DETAILED DESCRIPTION OF THE INVENTION

As will become evident from the following discussion, the present invention makes use of electroactive polymer materials (EAPs) that are capable of turning an electrical stimulation into a mechanical output. When voltage is applied to an EAP material to generate an electrical field, the material responds by altering the allocation of its volume. By appropriately configuring an EAP material, an actuator can be fabricated whose movement is controlled by the application of an electrical field to the EAP material. Conversely, it is possible to generate an electrical field with an actuator containing the EAP material by physically actuating the actuator. One aspect of the invention is a construction of an actuator using EAP materials and other polymeric materials that promote the flexibility of the actuator, which as used herein refers to the ability of the actuator and its various materials to be elastically deformed. Another aspect of the invention encompasses methods of manufacturing actuators from EAP materials, and still other aspects of the invention encompass systems that utilize such actuators. Particular but nonlimiting examples include sealing systems equipped with a sealing element that contains an EAP material capable of being actuated to provide a resealing capability. Such a capability can be utilized to extend the useful life of the sealing element capable by preferably preventing, interrupting, or at least reducing the amount of leakage at a sealing interface containing the sealing element. In such embodiments, distortions and other physical conditions of the sealing element that may occur due to regular cyclic loading, irregular loading, or damage to the sealing element are preferably monitored. In the event that distortion reduces the sealing effect of the sealing element below a certain threshold, electrical stimulation can be applied to the EAP material to modify the shape of the sealing element in a manner that increases its sealing effect, ideally for a time and to an extent sufficient to allow for the replacement of the sealing element before a catastrophic failure occurs. Such a capability can find uses with a variety of sealing elements, including o-rings, face seals, gaskets, etc., and in a wide variety of devices and machines in various industries, for example, the medical, automotive, aviation, aerospace, and appliance industries.

Preferred EAP materials for use with the present invention are dielectric elastomers, whose strain is nominally proportional to the square of the activating electric field. Various dielectric elastomers are known and can be used with the present invention, nonlimiting examples of which include the aforementioned VHB 4905 and 4910 acrylic-based materials commercially available from 3M. Other notable EAP materials include fluoropolymers, particularly FKM (hexafluoropropylene vinylidene fluoride copolymer), commercial sources of which include Parker Seals, Inc.

Figure 1:
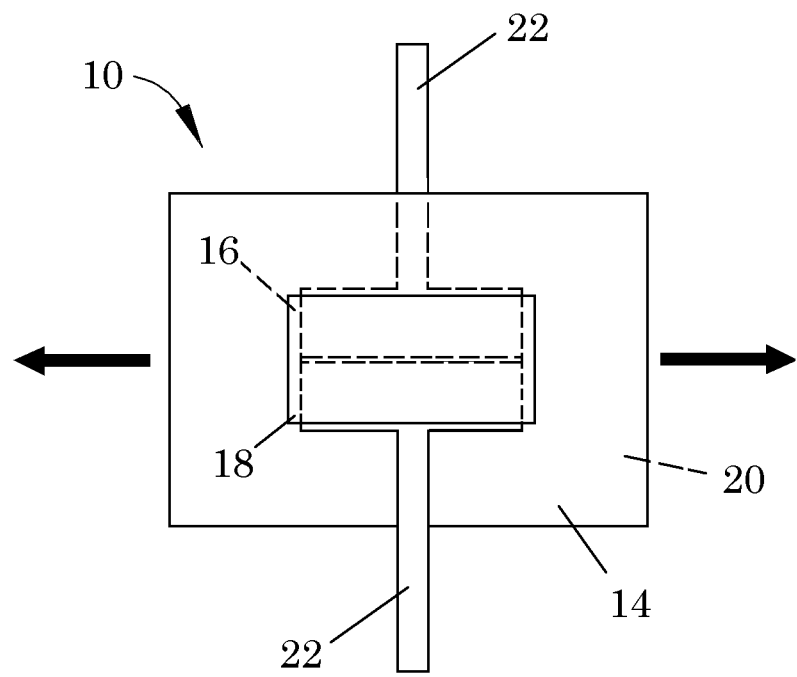
FIGS. 1 and 2 are plan and cross-sectional views, respectively, that schematically represent a planar multilayer configuration suitable for use as an actuator in accordance with certain embodiments of the present invention.
Figure 2:
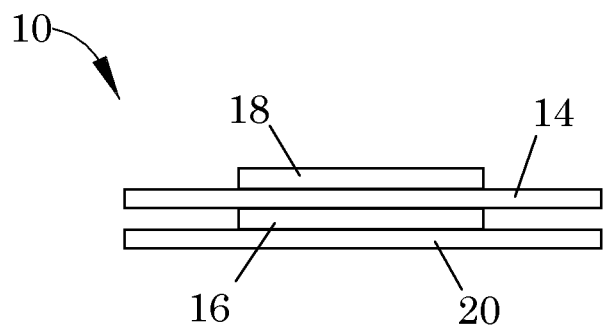

FIGS. 1 and 2 schematically represent an actuator 10 configured in accordance with a nonlimiting embodiment of the invention. As represented in FIGS. 1 and 2, the actuator 10 has a multilayer structure 12 comprising a layer 14 of an EAP material disposed between a pair of electrodes 16 and 18. An optional fourth layer 20 is represented in FIGS. 1 and 2 that, if present, is preferably also formed of an EAP material. In the configuration represented in FIGS. 1 and 2, the EAP material layer 14 between the electrodes 16 and 18 is referred to as an active layer because it is subjected to an electrical field applied as a result of an electrical potential being applied across the electrodes 16 and 18. When an electromagnetic field is applied through the electrodes 16 and 18, the EAP material of the layer 14 reallocates its volume, compressing in the thickness direction and expanding on the plane transverse to the thickness direction. The fourth layer 20 can be considered to be an inactive layer of the actuator 10, and its primary role is to prevent shorting between the electrode 16 and surrounding components of a system in which the actuator 10 is installed. The layers 14, 16, 18 and 20 contact and are bonded to each other so that the layers 14, 16, 18 and 20 expand and contract largely in unison, primarily in the plane parallel to the layers 14, 16, 18 and 20. For this purpose, adhesives or compression molding techniques may be used, though in preferred embodiments the layers 14, 16, 18 and 20 are bonded together by co-curing. Various co-curing techniques are foreseeable and within the scope of the invention.

Preferred materials for the electrodes 16 and 18 include electrically-conductive polymer materials that exhibit flexibility comparable to the EAP layer 14, though the use of other conductive materials is foreseeable and within the scope of the invention. Notable examples of suitable electrode materials include mixtures of conductive grease mixed with graphite, silver inks or paints, mixtures of silicone and graphite, and electrically-conductive silicone-based rubber materials. In the embodiment represented in FIGS. 1 and 2, the electrodes 16 and 18 are contacted by metal leads 22 through which the electrical potential is applied to the electrodes 16 and 18. A wide variety of flexible and substantially rigid conductive materials can be used to form the leads 22.

Suitable thicknesses for the layers 14, 16, 18, and 20 will depend on the particular application, the actuation displacement and forces desired, the potential that will be applied to the electrodes 16 and 18, and other factors that would be appreciated by those skilled in the art. Typically electrical potentials applied to the electrodes 16 and 18 can be in a range of 1000 to 10,000 volts AC or DC with low (micro-amp) current level requirements. Suitable power sources for generating acceptable electrical potentials are well known in the art and therefore will not be discussed in any detail here.

As indicated by arrows in FIG. 1, the active EAP layer 14 and, if present, the inactive EAP layer 20 are preferably pre-strained for the purpose of increasing deformations achievable with the dielectric EAP material of the layer 14. The strain is induced prior to the application and bonding of the electrodes 16 and 18 to the active EAP layer 14. Suitable techniques for pre-straining the EAP layers 14 and 20 include mechanical, electrical, radiation, and thermal techniques of types known in the art. For example, pre-straining of the EAP layers 14 and 20 can be mechanically induced with the use of unidirectional, bidirectional, and omnidirectional stretching equipment. However, during investigations leading to the invention, a chemical pre-straining technique was developed that is believed to be particularly suitable for certain EAP materials, such as the aforementioned fluorocarbon-based FKM EAP material (and potentially other EAP materials). Such a chemical treatment process generally entails contacting a sheet or film of the EAP material with a chemical that causes the EAP material to swell. In the case of fluorocarbon-based EAP materials, a suitable treatment chemical is methyl ethyl ketone (MEK), though the use of other chemicals is foreseeable. The treatment is carried out until the EAP material has sufficiently swelled, for example, as evidenced by a linear dimensional increase of about 100 percent or more. Thereafter, the EAP material is removed from contact with the chemical and allowed to dry, resulting in the EAP material substantially shrinking back to its original dimensions. Thereafter, the electrodes 16 and 18 can be applied to the surfaces of the EAP material, for example, individually to the EAP layers 14 and 20 or to opposite surfaces of the active EAP layer 14.

While not wishing to be held to any particular theory, with this process the EAP layers 14 and 20 appeared to retain a strain memory, allowing for the electrodes 16 and 18 to be attached thereto while the layers 14 and 20 are not in the process of being pre-strained or are in a physically pre-strained condition. Instead, the electrodes 16 and 18 can be attached to the EAP layers 14 and 20 after pre-strain has been released (i.e., the EAP material is no longer swelled). Such a technique is in contrast to prior practices that entail intentionally retaining a pre-strain in an EAP material during application of the electrodes, for example, with a stiffened region surrounding a pre-strained region of an EAP material to continuously apply a strain to the pre-strained region while the electrodes are being attached. Consequently, the present invention encompasses a method of fabricating an actuator that entails pre-straining an EAP material, and then releasing the strain to induce a strain memory in the EAP material prior to application of electrodes thereto, and until such a time as the resulting actuator (10) is activated by the application of an electric field with the electrodes (16 and 18). Though investigations leading to the invention induced strain memory in an EAP material through a chemical treatment that caused the material to swell, it is foreseeable that strain memory could be induced in a variety of EAP materials through the use of other pre-straining techniques that expand the EAP material and then release the EAP material to allow the material to shrink and return or nearly return to its pre-strained dimensions.

As represented in FIG. 1, the leads 22 are preferably disposed in a direction transverse to the direction that the EAP layer 14 is pre-strained. This orientation is believed to be preferred following investigations that indicated that maximum actuation of the EAP layer 14 occurs if power is applied in this manner.

As a result of the application of a suitable electrical potential to the electrodes 16 and 18, the EAP layer 14 is deformed between the electrodes 16 and 18 with the result that the EAP layer 14 expands in at least one direction and preferably in both directions that are parallel to the plane of the actuator 10 and, if applicable, to the plane in which the pre-strain was induced in the EAP layer 14.

Figure 3:
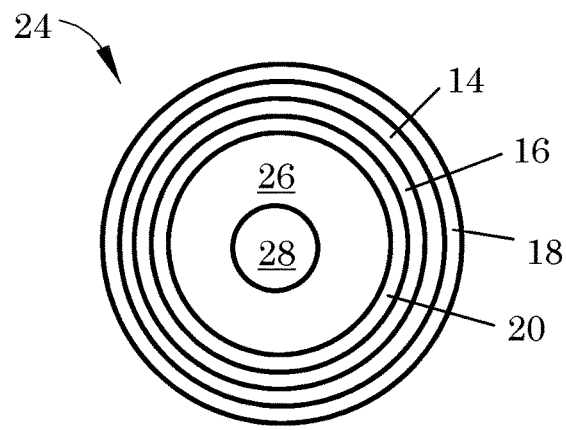
FIG. 3 is a cross-sectional representation showing a rolled multilayer structure that can be fabricated from the planar multilayer configuration represented in FIGS. 1 and 2.
Figure 4:
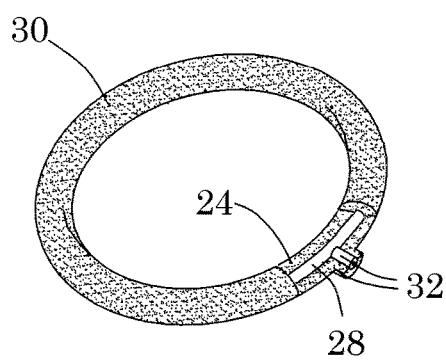
FIGS. 4 and 5 represent o-ring seals adapted to have a resealing capability and contain a polymer sensing element in accordance with certain embodiments of the invention.
Figure 5:
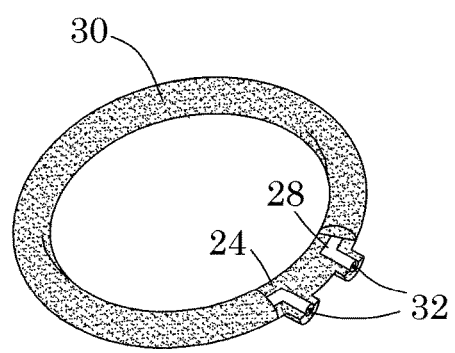

The planar multilayer actuator 10 of FIGS. 1 and 2 can be incorporated into a wide variety of components having a wide variety of shapes including various different cross-sectional shapes, and can be located at various locations on or within such shapes, for example, corners, edges, along radii, etc., depending on the intended effect of actuating the actuator 10. Whereas FIGS. 1 and 2 schematically represent a planar multilayer configuration for the actuator 10, rolled linear actuators can also be fabricated using the general structure of FIGS. 1 and 2 to yield an actuator capable of expanding and contracting in length while generating greater forces than would otherwise be capable with the planar configuration of FIGS. 1 and 2. As represented in FIG. 3, in the fabrication of a rolled actuator 24 the multilayer structure represented in FIGS. 1 and 2 can be rolled to completely surround a core 26, for example, a flexible polymer core, so that the inactive layer 20 contacts and is preferably bonded to the core 26 and the entire actuator 24 exhibits a degree of flexibility. Various other types of cores 26 are also foreseeable, including springs and more pliable or rigid materials. The actuator 24 of FIG. 3 can have a generally cylindrical shape or another suitable shape for an actuating application. As a nonlimiting example, one or more linear actuators 24 of the type represented in FIG. 3 can be configured to form an annular shape capable of nonlinear actuation, e.g., increasing the circumference of an annular shape. Two nonlimiting examples of annular-shaped actuators are represented in FIGS. 4 and 5 in the form of o-ring seals 30. By incorporating one or more actuators 24 of a type represented in FIG. 3, the seals 30 are capable of expanding in their diametrical size through the application of an electrical potential to the electrodes 16 and 18 of the actuator(s) 24. Such a capability can be used to address leakage past the seals 30 resulting from damage caused by compression setting, an improper o-ring size relative to the groove in which the seal 30 is installed, or various other potential causes for leakage past an o-ring.

To more fully implement the capabilities of seals 30 of the type represented in FIGS. 4 and 5, a preferred aspect of the invention involves the use of polymer materials that exhibit electrical properties to provide the capability of monitoring the condition of the seals 30 or, for that matter, any polymer component formed of or otherwise containing an actuator within the scope of the invention. Such a feature is taught in U.S. Pat. No. 7,752,904, whose teachings regarding the construction, operation and use of sensing elements formed of electrically-conductive polymer materials are incorporated herein by reference. In FIGS. 3, 4 and 5, an electrically-conductive polymer material is present in the form of a sensing element 28 and is an integral feature of each seal 30 for the purpose of creating an electrical component capable of indicating the condition of the seal 30. Though the following discussion will refer to the o-ring seals 30 represented in FIGS. 4 and 5, it will be apparent from the following discussion that various other polymer components can be constructed of one or more actuators 10 and/or 24 and sensing elements 28, including but are not limited to various other types of seals (including face seals and gaskets) and various other structures that may be subject to transitory and permanent distortions leading to degradation of their performance.

As taught in U.S. Pat. No. 7,752,904, the output of the polymer sensing element 28 can be coupled to circuitry capable of indicating that a failure has or will soon occur within the seal 30 based on its degree of distortion. In some cases, the sensing element output can be coupled to data processing circuitry capable of predicting when a structural failure of the seal 30 will occur in the future, and then cause the actuator 24 within the seal 30 to actuate so that the seal 30 can continue to be safely after the occurrence of distortion that would ordinarily have ended its useful life. In this manner, damage that might otherwise have occurred as a result of leakage can be prevented or at least delayed until such time that the seal 30 can be replaced.

Materials suitable for forming the polymer sensing elements 28 are preferably capable of transmitting electric signals, yet retain physical properties that are superior to metals and other traditional conductor materials that are conventionally used to form sensing elements. Suitable polymer materials are also preferably capable of being fully embedded or otherwise integrated into the body of the seal 30 or other polymer component to be monitored, necessitating that the polymer sensing element 28 do not interfere with or degrade the desired properties of the polymer component. In so doing, the polymer sensing element 28 is able to monitor the structural integrity, loading, and other measurable factors of the polymer component to provide useful information regarding the component.

Because the polymer sensing element 28 is required to transfer an electric signal, at least part of the sensing element 28 must be capable of at least measurable conductivity. For example, if the sensing element 28 is part of a capacitive sensor, a conductive polymer material is used to form two conductive components separated by a dielectric. Measurable resistivity or conductivity is also required if the sensing element 28 is part of a resistive or inductive sensor. To achieve an adequate level of conductivity in an otherwise dielectric polymer material, some type of conductive material should be added to the base polymer material of the sensing element. While the addition of metal filler can achieve an acceptable level of electrical conductivity, a preferred approach is to add conductive materials that, aside from electrical conductivity, will have little effect on the physical properties of the polymer material. Carbon black (a form of amorphous carbon having a high surface area to volume ratio) has the capability of significantly lowering the resistivity of certain rubber materials when added at appropriate levels. Charge is believed to move through carbon polymer composites by way of tunneling of charge carriers, in which current flows as electrons travel through continuous carbon pathways and jump any gaps to get to the next pathway. On this basis, resistivity (and, inversely, conductivity) would be expected to be largely dependent on carbon black content. Carbon black generally does not adversely affect desirable properties of elastomers and polymers and in fact can promote certain properties if used in appropriate amounts, and is believed to be a particularly suitable conductive filler material. Other potential additives that could be used include conductive salts. It is believed that a threshold of approximately 25% by volume of conductive filler (such as carbon black) typically must be reached before significant conductive properties are achieved, for example, resistivities of about 1 ohm-cm or less (corresponding to conductivities of about 0.1 $(\text{ohm-cm})^{-1}$ or more).

The seals 30 represented in FIGS. 4 and 5 represent different embodiments for polymer sensing elements 28. In these embodiments, the seals 30 are configured to utilize capacitance or resistivity to detect various strain and anomaly-related failure modes, for example, extrusion from a seal retaining gap, excessive squeeze, breakage or cracking, wear, stretching, twisting, and/or incorrect assembly. As the conductive polymer sensing elements 28 of the seals 30 strain under these failure modes, electrical properties of the sensing elements 28 change. For example, the electrical capacitance or resistance of the sensing element 28 can be continuously or intermittently measured or otherwise monitored to indicate the overall strain of the seal 30, as well as seal breakage. Relationships can be developed for given seal designs and materials that correlate electrical resistance to strain, as well as electrical resistance (or strain) to a model by which the remaining life of the seal 30 can be predicted and a signal (digital, audio, visual, etc.) can be generated if the electrical resistance exceeds a predetermined threshold value for the seal 30. In this manner, the seals 30 are able to indicate performance issues prior to catastrophic failure, and can be used in a wide variety of applications.

For the construction of the seal 30 in FIG. 4, the sensing element 28 comprises internal and external conductive polymer components separated by an intermediate polymer component (not shown). The intermediate polymer component is formed of a dielectric material and completely separates the internal and external components to form a capacitor. A charge can be applied across the internal and external components through a pair of contacts or leads 12 located on the outer periphery of the seal 30 and any suitable power source of a type well known in the art. Capacitance is monitored to indicate the presence of an anomaly that may lead to the failure of the seal 30. Application of an electric potential across the leads 32 can be continuous or intermittent, and changes in the output of the sensing element 28 can be monitored with any suitable processing equipment of types well known in the art and capable of indicating a failure or potential failure condition based on the output of the element 28 exceeding a predetermined threshold value.

In FIG. 5, the sensing element 28 is formed of a conductive polymer material to which a charge can be applied through a pair of contacts or leads 32 located on the outer periphery of the seal 30, such that current effectively flows along the entire circumferential length of the seal 30. The current flow or resistance between the leads 32 of the sensing element 28 is monitored to indicate the presence of an anomaly that may lead to the failure of the seal 30. As with the embodiment of FIG. 4, the application of the electric potential across the leads 32 can be continuous or intermittent, and changes in the output of the sensing element 22 can be monitored and failure indicated by the output exceeding a predetermined threshold value for the output.

Figure 6:
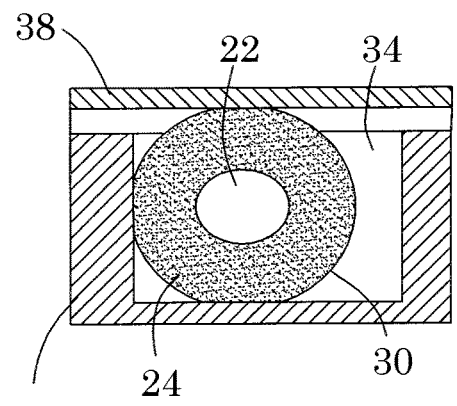
FIG. 6 is a cross-sectional representation of the o-ring seal of FIGS. 4 and 5 disposed in an o-ring groove in the absence of pressure-induced distortion.
Figure 7:
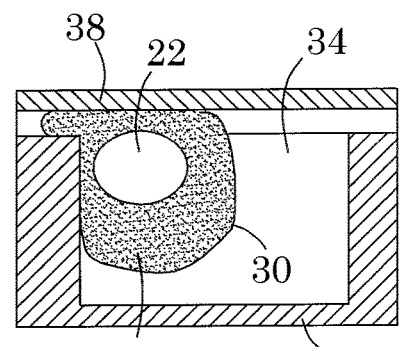
FIG. 7 is a cross-sectional representation of the o-ring seal of FIG. 6 subjected to conditions that have distorted the o-ring seal to the point of impending failure.
Figure 8:
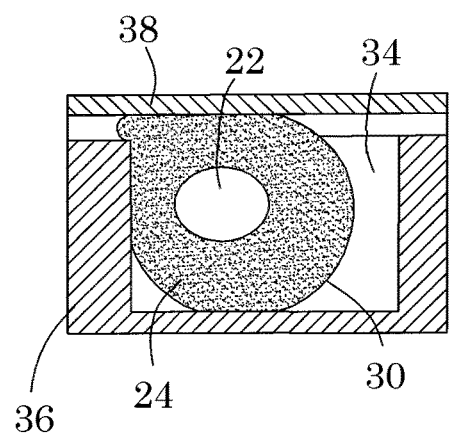
FIG. 8 is a cross-sectional representation of the o-ring seal of FIG. 6 subjected to conditions similar to that of FIG. 7, but showing the o-ring seal as being actuated to increase the sealing effect of the seal within the groove.

FIGS. 6, 7 and 8 represent one of the seals 30 of FIG. 4 or 5 disposed in a groove 34 for providing fluidic sealing between two components 36 and 38. Contact with the electrodes 16 and 18 for the actuator 24 and the electrodes 32 for the sensing element 28 can be through separate flexible leads routed out of the groove 34 or conductors defined on or by one or more walls of the groove 34 and/or the component 38 closing the groove 34. The seal 30 is represented in FIG. 6 in an undeformed state, whereas the deformation represented in FIG. 7 is illustrative of seal extrusion that would indicate an impending failure of the seal 30 characterized by a partial or complete loss in the sealing effect of the seal 30. The distortion of the seal 30 can be seen to have caused the seal 30 to occupy a reduced cross-sectional area of the groove 34. The distortion of the seal 30 would also cause a significant change in one or more electrical properties (for example, resistivity) of the sensing element 28, and sufficient to cause the value of a signal corresponding to the electrical property to exceed or drop below a predetermined threshold value established for the seal 30, for example, based on previous baseline tests of identical or similar seals. FIG. 8 represents an example of the actuation of the actuator 24 within the seal 30 for the purpose of counteracting the deformation represented in FIG. 7. In particular, in response to a signal generated from the sensing element 28, an electric potential has been applied to the electrodes (not shown) of the actuator 24, causing the seal 30 to diametrically expand and occupy an increased cross-sectional area of the groove 34, such that the sealing effect of the seal 30 has been increased if not substantially restored.

While the invention has been described in terms of specific embodiments, it is apparent that other forms could be adopted by one skilled in the art. For example, the physical configurations of the actuators 10 and 24 and of the polymer components equipped with the actuators 10 and 24 could differ from those shown, and materials and processes other than those noted could be use. Therefore, the scope of the invention is to be limited only by the following claims.

The invention claimed is:

1. An actuator having a multilayer structure comprising:
   first and second electrodes formed of electrically-conductive polymer materials; and
   an electroactive polymer layer formed of a dielectric elastomer, the electroactive polymer layer being between and bonded to the first and second electrodes so as to have a thickness dimension therebetween;
   wherein the multilayer structure is adapted so that applying an electric potential to the first and second electrodes causes the electroactive polymer layer to expand in at least one dimension thereof transverse to the thickness dimension of the electroactive polymer layer;
   wherein the electroactive polymer layer is in a strain memory state induced by a pre-straining technique that expands the electroactive polymer layer and then releases the electroactive polymer layer to allow the electroactive polymer layer to substantially shrink to pre-strained dimensions thereof prior to bonding of the first and second electrodes thereto.

2. The actuator according to claim 1, wherein the strain memory state was induced by a chemical pre-straining technique that swells the dielectric material and then allows the electroactive polymer layer to substantially shrink to pre-swelled dimensions thereof prior to bonding of the first and second electrodes thereto.

3. The actuator according to claim 1, wherein the actuator further comprises an elastomeric core completely surrounded by the multilayer structure.

4. The actuator according to claim 3, wherein the electroactive polymer layer is a first electroactive polymer layer of the actuator, and the actuator further comprises a second layer of an electroactive polymer material between and bonded to the elastomeric core and the first electrode.

5. The actuator according to claim 4, wherein the second layer of the electroactive polymer material is in a strain memory state induced by a pre-straining technique that expands the second layer and then releases the second layer to allow the second layer to substantially shrink to pre-strained dimensions thereof prior to bonding the elastomeric core and the first electrode thereto.

6. The actuator according to claim 4, wherein the second layer of the electroactive polymer material is in a strain memory state induced by a chemical pre-straining technique that swells the second layer and then allows the second layer to substantially shrink to pre-swelled dimensions thereof prior to bonding of the elastomeric core and the first electrode thereto.

7. The actuator according to claim 1, the actuator further comprising means for monitoring distortion of the actuator, the actuator being connected to means for applying the electric potential in response to the monitoring means, wherein the monitoring means comprises:
   an electrically-conductive polymer sensing element integrally incorporated into the actuator;
   means for applying a second electric potential to the polymer sensing
   means for sensing an electric signal generated by the polymer sensing element in response to the polymer sensing element physically responding to distortion of the actuator; and
   means for applying the electric potential to the first and second electrodes if the electric signal exceeds a predetermined threshold value corresponding to the distortion of the actuator attaining a predetermined level.

8. The actuator according to claim 1, wherein the actuator is a sealing element.

9. The actuator according to claim 8, wherein the sealing element has an annular shape, the multilayer structure completely surrounds an elastomeric core, the sealing element is disposed in a groove, distortion of the sealing element causes the sealing element to occupy a reduced cross-sectional area of the groove, and applying the electric potential to the first and second electrodes causes the sealing element to expand to occupy an increased cross-sectional area of the groove.

* * * * *